INVENTOR
HWA N. YU

BY John F. Ohlandt Jr.
ATTORNEY

United States Patent Office 3,366,517
Patented Jan. 30, 1968

3,366,517
FORMATION OF SEMICONDUCTOR DEVICES

Hwa N. Yu, Yorktown Heights, N.Y., assignor to International Business Machines Corporation, New York, N.Y., a corporation of New York Filed Sept. 23, 1964, Ser. No. 398,540
11 Claims. (Cl. 148—175)

ABSTRACT OF THE DISCLOSURE

The process of the present invention is utilized in fabricating a wide band gap emitter transistor and consists of epitaxially growing a crystalline structure composed of a first region of a first elemental semiconductor material which has a predetermined band gap, Ge, for instance, and a second region of a compound semiconductor material having a different band gap, GaAs, for instance, where the first and second regions are the same conductivity type. The process includes the step of heating the resulting structure to diffuse one of the elemental components of the compound semiconductor material, arsenic, for example, from the second region to the first region to convert a portion of the first region to opposite conductivity type. Using this technique, p-n-p or n-p-n transistors can be formed which by virtue of a single heating step simultaneously form a homojunction and a heterojunction. The present process permits the fabrication of a transistor which uniquely achieves the advantages of a drift field and of a wide gap emitter.

As the semiconductor art has developed, great emphasis has been placed on obtaining extremely high speeds for operation of devices, most notably in the computer field where such devices are employed for logical switching. An extremely useful type of transistor device for this purpose has been the so-called drift field transistor, in which the base region is formed by a technique of diffusion of impurities into the semiconductor body such that a gradient of impurity concentration results in the base region. As a consequence of the gradient a drift field is imposed in such direction as to aid the transport of minority carriers from emitter to collector through the base region. For a fuller description of the diffusion technique and its advantages in device fabrication, reference may be made to an article, "A High Frequency Diffused Base Germanium Transistor," by C. A. Lee, Bell Systems Technical Journal, January 1956.

Another feature in transistor design that has also received much attention, at least from a theoretical standpoint, has been the so-called wide gap emitter. The concept of a wide gap emitter may be appreciated by referring to an article by H. Kromer entitled, "Quasi Electric and Quasi Magnetic Fields in Non Uniform Semiconductors," RCA Review, September 1957 at page 336 thereof. The wide gap emitter consists essentially of a semiconductor structure comprising two regions, in one of which the material has a wider band gap than in the immediately adjacent region. Such an emitter is employable in a transistor device to improve the injection efficiency at the emitter, while allowing for reduction in emitter capacitance by reason of the permissible decrease in emitter doping. However, although the wide gap emitter has been much studied and discussed, it has not heretofore been successfully implemented fully in a practical device.

A development which is related to the attainment of a wide gap emitter is a process which may be generally designated vapor growth and which has been thoroughly reported on in the literature. See, for example, the IBM Journal of Research and Development, July 1960. Vapor growth, and more particularly the specific form of vapor growth by a halide reaction as discussed in the aforesaid IBM Journal article, is uniquely adapted to the fabrication of heterojunction structures which readily embody the concept of a wide gap emitter. Thus, by reason of the ease with which semiconductor materials having significantly different band gaps can be crystallographically united by vapor growth, the wide gap emitter can be effectively realized. For a detailed description of a low temperature vapor growth process for forming abrupt junction heterocrystalline structures, reference may be made to Patent No. 3,072,507, assigned to the assignee of this application.

Accordingly, the primary object of the present invention is to provide a technique for the fabrication of transistors which uniquely achieves the advantages of a drift field and of a wide gap emitter.

A feature of the present invention resides in the process comprising the steps of epitaxially forming the initial crystalline structure composed of a region of a first semiconductor material having a first band gap and another region composed of a second semiconductor material having a different band gap, and diffusing one of the constituents of the second semiconductor material into the first material in which the constituent acts as a dopant, to define thereby the drift field base region for the transistor.

The foregoing and other objects, features and advantages of the invention will be apparent from the following more particular description of preferred embodiments of the invention, as illustrated in the accompanying drawings.

Figure 1:
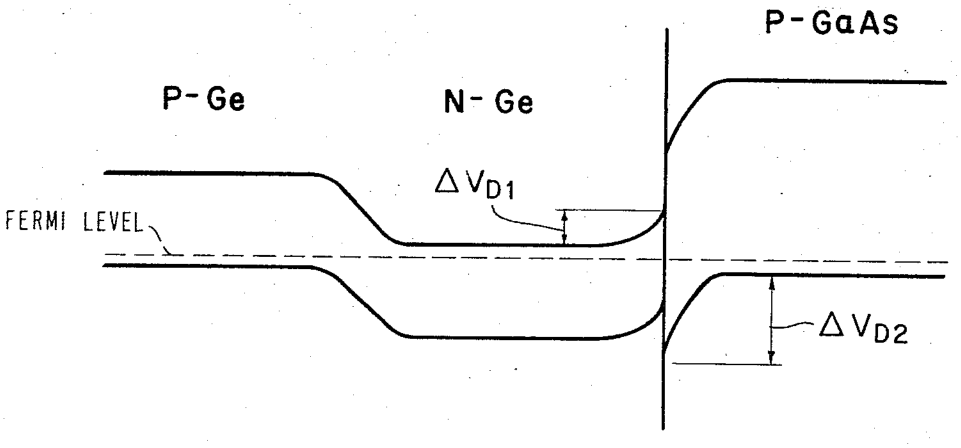
FIGURE 1 depicts the energy band diagram for a pnp, wide gap emitter, transistor.

Referring now to FIGURE 1, there is shown the band diagram for a pnp, wide gap emitter, transistor which incorporates a p-type GaAs emitter, an n-type Ge base, and a p-type Ge collector. The increase in injection efficiency obtained with the device is due primarily to the separation of the conduction band of the np heterojunction, that is, at the barrier between the n-type Ge and p-type GaAs shown on the right in FIGURE 1. This separation effectively cuts down the electron injection in the reverse direction and thereby decreases the injection deficit.

The distribution of the diffusion potential across the heterojunction between the two materials depends upon the relative doping and the dielectric constants of the two materials. When the emitter is not as heavily doped as the base region the emitter capacitance will then depend upon the emitter doping, whereas in the case of a homojunction transistor the emitter capacitance is dependent upon the base doping.

The technique of the present invention will be referred to as a post-epitaxial diffusion method of fabricating transistors. The specific case referred to above of the use of GaAs as the material for the emitter and Ge as the material for the base and collector of a transistor will be described in detail. However, it will be obvious that the principles disclosed herein are applicable to a wide range of combinations of materials.

Figure 2A:
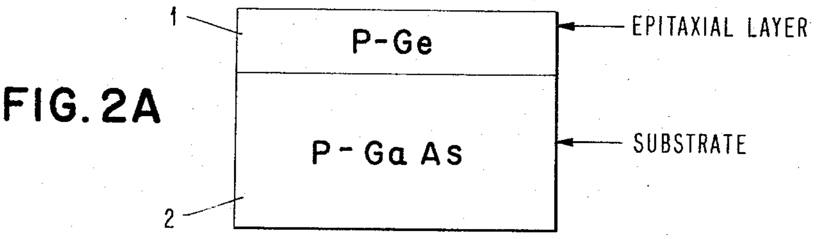
FIGURES 2A and 2B illustrate the different steps of the process of fabrication according to the present invention.

Preferably by using the vapor growth method, previously outlined, a p-p Ge-GaAs heterojunction is formed as shown in FIG. 2A consisting of regions 1 and 2. Usually the grown layer is the Ge layer 1. Thus, the substrate is selected to be constituted of the compound semiconductor GaAs and by following the procedure disclosed in Patent No. 3,072,507 the region 1 of Ge of p conductivity type is grown epitaxially upon a GaAs substrate. However, rather than selecting a substrate of GaAs which is n conductivity type, as in Patent No. 3,072,507 a p conductivity type substrate is chosen instead. The region 1 is epitaxially grown upon the substrate 2 at a temperature of approximately 400° so that at this point very little diffusion takes place between the substrate and the grown layer.

Figure 2B:
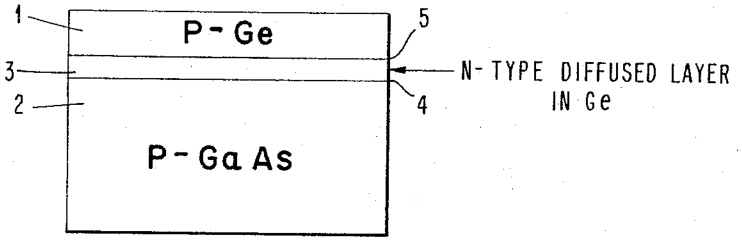

In the next step of the process of the present invention the heterojunction, depicted in FIGURE 2A, is then heat treated under As pressure in a closed tube at around 500° C. to 700° C. Under such elevated temperature conditions the volatile constituent, As, diffuses out of the GaAs leaving excess Ga in the GaAs. The As diffuses into the Ge directly at the interface of the p-p heterojunction, following the normal reverse error function. As a result, the layer 3 of n-type Ge is thereby created between the p-type GaAs and the p-type Ge as shown in FIGURE 2B having a gradient of impurity concentration therein. Thus, a pn GaAs-Ge heterojunction 4 and pn Ge homojunction 5 are formed by this post-epitaxial diffusion process. Considering that the GaAs-Ge heterojunction is used as the emitter and the Ge homojunction is used as the collector, a pnp, wide-gap emitter, drift field base, transistor results.

Figure 3:
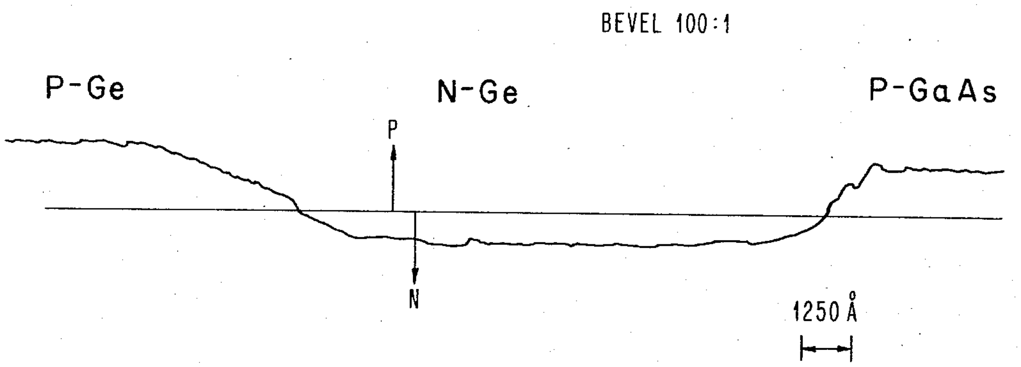
FIGURE 3 is a plot of the thermoelectric voltage with distance in a pnp, wide gap emitter, transistor structure.

In FIGURE 3 there is shown a plot of the thermoelectric voltage variation obtained for one unit embodying the concept of the present invention. It will be noted in particular that the interface of the p-type GaAs and the n-type of Ge shows a gradual transition of the thermal voltage. Since the sample is mounted on a 100 to 1 bevelled surface and the local heating of the thermal probe takes the average of the thermal voltage of the materials surrounding the probe, it should not be expected that there would be seen an abrupt transition since the effective resolution of the thermal probe becomes questionable.

In the particular unit, for which the results as depicted in FIGURE 3 were obtained, the base region had a thickness of 1.3 microns. With several other runs, involving times of 30 minutes and 180 minutes for the diffusion operation, base region thicknesses of 0.55 micron and 1.7 microns were obtained, respectively. This data appeared to agree approximately with the error function distribution based on constant surface concentration. Using this data one can extrapolate the surface concentration to be about $10^{19}$ atoms/cc. and with the background impurity, namely Ga in this case, being of the order of $10^{18}$ atoms/cc.

Figure 4:
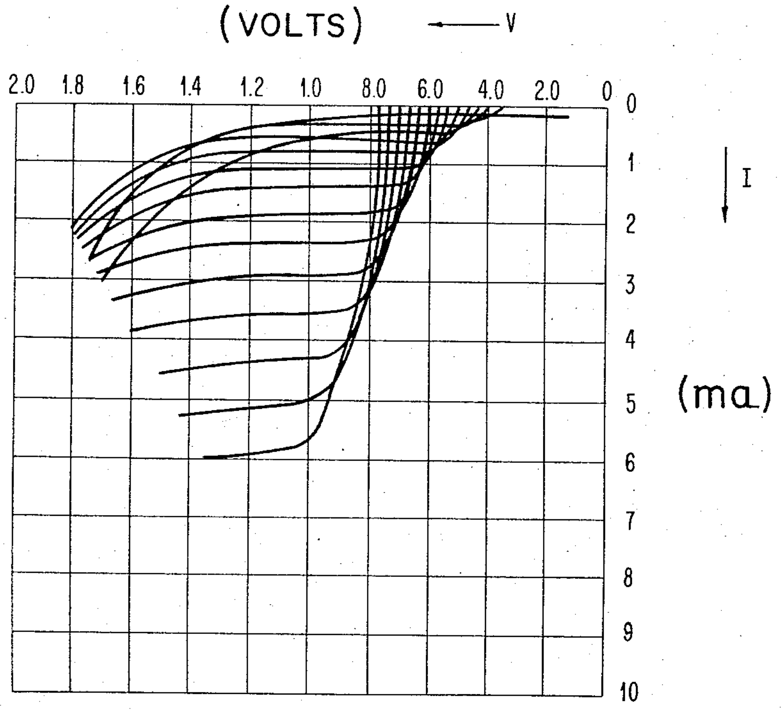
FIGURE 4 is a graph of the grounded emitter output characteristics of a typical transistor fabricated in accordance with the present invention.

The particular pnp, wide-gap emitter, transistor, having a 1.3 micron base width, as referred to in connection with FIGURE 3, exhibits grounded emitter-output characteristics, as shown in FIGURE 4. In the base current range of 40 ma. to 60 ma. the $\beta$ is of the order of 0.15 to 0.20 corresponding to an $\alpha$ of the order of 0.13 to 0.17. The low current amplification observed with the particular unit is no indication of the high injection efficiency predicted in theory, assuming that the base width is within a diffusion length. The factor of importance here would be the interface surface states acting as recombination centers. The increasing $\alpha$ with increasing current of this transistor is consistent with the notion that these states are becoming filled or swamped at high carrier injection level. However, it has not been completely determined what the limiting factor on $\alpha$ is in this case.

It will be understood that, although the formation of a pnp transistor has been described as one embodiment of the technique of the present invention, the opposite polarity transistor, that is, an npn transistor, can just as readily be obtained following the technique of the present invention. Thus, for example an n-n type of heterojunction would first be formed involving different semiconductor materials having significantly different band gaps. Then, simply by judicious adjustment of the diffusion parameters of time and temperature the requisite p-type base region is created between the two regions of n conductivity type by insuring that the p-type determining impurity that forms one constituent of the compound semiconductor is diffused so that it predominates in a portion of region 1.

It is to be noted also that many other combinations of materials can be employed rather than the combination of Ge and GaAs that has been described. For example, dissimilar semiconductors such as silicon and GaP can be crystallographically united, typically by growing silicon on a GaP substrate. In this case the structure comprising the two separate regions of Si and GaP is heated such that P is diffused out of the region constituted of GaP and will convert a portion of the region of Si, selected to be of p conductivity type, to n conductivity type. Thus, there is realized the same essential pnp transistor described in connection with the use of Ge and GaAs.

What has been disclosed is a novel technique simply referred to as a post-epitaxial diffusion method of fabricating transistors which uniquely and easily affords the blending of the feature of a wide gap emitter in a transistor structure with the incorporation of a drift field therein. Such a structure lends itself to high speed switching applications.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process of forming a transistor comprising the steps of epitaxially growing a crystalline structure composed of a first region of an elemental semiconductor material having a predetermined band gap and a second region of a compound semiconductor material having a different band gap, said first and second regions having the same conductivity type, heating said crystalline structure to diffuse one of the elemental components of said compound semiconductor material from said second region into said first region to convert a portion of said first region to opposite conductivity type.

2. A process of forming a transistor comprising the steps of epitaxially growing a structure composed of one region of a first elemental semiconductor material having a predetermined band gap and being of predetermined conductivity type, and another region of a second, compound semiconductor material having a band gap greater than the band gap of said first semiconductor material and of the same conductivity type as said first material, heating the structure thus formed to diffuse one of the elemental components of said compound semiconductor material from said other region into said one region to convert thereby a portion of said one region to opposite conductivity type.

3. A process of forming a transistor structure comprising the steps of epitaxially growing a structure composed of one region of a first elemental semiconductor material having a predetermined band gap and of p conductivity type, and another region of a second, compound semiconductor, material having a band gap greater than the predetermined band gap of said first semiconductor material, and of p conductivity type, heating the structure thus formed to diffuse one of the elemental components of said compound semiconductor material from said other region into said one region to convert thereby a portion of said one region to n conductivity type.

4. A process of forming a transistor comprising the steps of epitaxially growing a structure composed of one region of a first elemental semiconductor material having a predetermined band gap and of n conductivity type, and another region of a second compound semiconductor, material having a band gap greater than the predetermined band gap of said first semiconductor material and of n conductivity type, heating the structure thus formed to diffuse one of the elemental components of said compound semiconductor material into said one region to convert thereby a portion of said one region to p conductivity type.

5. A process of forming a transistor comprising the steps of epitaxially growing a structure composed of a first region of Ge of predetermined conductivity type, and another region of GaAs of the same predetermined conductivity type as said first region, heating the structure thus formed to diffuse one of the elemental components of said GaAs from said other region onto said one region to convert thereby a portion of said one region to opposite conductivity type.

6. A process of forming a transistor comprising the steps of epitaxially growing a structure composed of a first region of Si of predetermined conductivity type and another region of GaP of the same predetermined conductivity type as said first region, heating the structure thus formed to diffuse one of the elemental components of said GaP from said other region into said one region to convert thereby a portion of said one region to opposite conductivity type.

7. A process of forming a transistor comprising the steps of epitaxially growing a region of a first elemental semiconductor material having a predetermined band gap and of predetermined conductivity type onto a substrate of a second, compound semiconductor, material having a band gap greater than the band gap of said first semiconductor material and of the same conductivity type as said first material, heating the structure thus formed to diffuse one of the elemental components of said compound semiconductor material from said substrate into said region to convert thereby a portion of said region to opposite conductivity type.

8. A process of forming a transistor comprising the steps of epitaxially growing a region of a first elemental semiconductor material having a predetermined band gap and of p conductivity type onto a substrate of a second, compound semiconductor, material having a band gap greater than the gap of said first semiconductor material and of p conductivity type, heating the structure thus formed to diffuse one of the elemental components of said compound semiconductor material from said substrate into said region to convert thereby a portion of said one region to n conductivity type.

9. A process of forming a transistor comprising the steps of epitaxially growing a region of a first elemental semiconductor material having a predetermined band gap and of n conductivity type onto a substrate of a second, compound semiconductor, material having a band gap greater than the band gap of said first semiconductor material and of n conductivity type, heating the structure thus formed to diffuse one of the elemental components of said compound semiconductor material from said substrate into said region to convert thereby a portion of said region to p conductivity type.

10. A process of forming a transistor comprising the steps of epitaxially growing a region of Ge of predetermined conductivity type onto a substrate of GaAs of the same predetermined conductivity type as said region, heating the structure thus formed to diffuse arsenic from said substrate into said region to convert thereby a portion of said region to opposite conductivity type.

11. A process of forming a transistor comprising the steps of epitaxially growing a region of Si of predetermined conductivity type onto a substrate of GaP of the same conductivity type as said region, heating the structure thus formed to diffuse phosphorus into said region to convert thereby a portion of said region to opposite conductivity type.

References Cited

UNITED STATES PATENTS

| | | | |
|---|---|---|---|
| 2,929,859 | 3/1960 | Loferski | 148—191 |
| 2,974,262 | 3/1961 | Abraham | 252—62.3 |
| 3,089,794 | 5/1963 | Marinace | 148—188 |
| 3,132,057 | 5/1964 | Greenberg | 148—33.4 |
| 3,145,125 | 8/1964 | Lyons | 148—175 |
| 3,149,395 | 9/1964 | Bray et al. | 148—175 |
| 3,234,057 | 2/1966 | Anderson | 148—174 |
| 3,290,175 | 12/1966 | Cusano et al. | 148—33.4 |
| 3,290,175 | 12/1966 | Cusano et al. | 148—33 X |

DAVID L. RECK, *Primary Examiner.*

N. F. MARKVA, P. WEINSTEIN,
*Asisstant Examiners.*